United States Patent
Yasuhara et al.

(10) Patent No.: US 9,786,826 B2
(45) Date of Patent: Oct. 10, 2017

(54) LED LIGHT-EMITTING ELEMENT

(71) Applicants: CITIZEN ELECTRONICS CO., LTD., Fujiyoshida-shi, Yamanashi (JP); CITIZEN HOLDINGS CO., LTD., Tokyo (JP)

(72) Inventors: Makoto Yasuhara, Fujiyoshida (JP); Yusuke Watanabe, Fujiyoshida (JP)

(73) Assignees: CITIZEN ELECTRONICS CO., LTD., Yamanashi (JP); CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 15/226,312

(22) Filed: Aug. 2, 2016

(65) Prior Publication Data

US 2017/0040514 A1 Feb. 9, 2017

(30) Foreign Application Priority Data

Aug. 3, 2015 (JP) .................................. 2015-153355

(51) Int. Cl.
H01L 21/00 (2006.01)
H01L 33/60 (2010.01)
H01L 33/50 (2010.01)

(52) U.S. Cl.
CPC ............ *H01L 33/60* (2013.01); *H01L 33/505* (2013.01)

(58) Field of Classification Search
CPC ......... H01L 33/60; H01L 33/505; F21V 23/02
See application file for complete search history.

(56) References Cited

U.S. PATENT DOCUMENTS

| 7,334,907 | B2 | 2/2008 | Nagayama | |
|---|---|---|---|---|
| 9,231,166 | B2* | 1/2016 | Lee | ........................ H01L 33/486 |
| 2004/0066140 | A1* | 4/2004 | Omoto | ................. H05B 33/145 |
| | | | | 313/512 |
| 2008/0106186 | A1* | 5/2008 | Ishii | ..................... C09K 11/7734 |
| | | | | 313/503 |
| 2009/0140630 | A1* | 6/2009 | Kijima | ................. C09K 11/661 |
| | | | | 313/498 |
| 2010/0200874 | A1* | 8/2010 | Shioi | .................. C09K 11/0883 |
| | | | | 257/91 |
| 2011/0006325 | A1* | 1/2011 | Ishii | ...................... H01L 33/502 |
| | | | | 257/98 |

(Continued)

FOREIGN PATENT DOCUMENTS

| JP | 2005-277227 A | 10/2005 |
|---|---|---|
| JP | 2009-283988 A | 12/2009 |

*Primary Examiner* — Laura Menz

(74) *Attorney, Agent, or Firm* — RatnerPrestia

(57) ABSTRACT

An LED light-emitting element having reduced the occurrence of illuminance unevenness is provided. A light-emitting element comprising a substrate, an LED element mounted on the substrate, a phosphor resin arranged on the substrate so as to seal the LED element and having an emission surface from which light based on light emitted from the LED element is emitted, a reflective resin arranged around the phosphor resin; and a reflecting frame having an opening and at least part of which is arranged on the reflective resin, wherein the reflective resin is arranged directly under the reflecting frame and on the side surface of the phosphor resin, the ratio of the area of the emission surface to the area of an inside area of the reflecting frame is set to 80% or higher, and in the inside area of the reflecting frame, the reflective resin is exposed around the emission surface.

3 Claims, 5 Drawing Sheets

(56) References Cited

U.S. PATENT DOCUMENTS

| | | | | |
|---|---|---|---|---|
| 2011/0050071 | A1* | 3/2011 | Chung | F21K 9/00 313/46 |
| 2012/0119234 | A1* | 5/2012 | Shioi | H01L 33/502 257/88 |
| 2013/0341666 | A1* | 12/2013 | Yoshida | H01L 24/97 257/98 |
| 2015/0076534 | A1* | 3/2015 | Terakami | H01L 25/0753 257/89 |
| 2015/0115793 | A1* | 4/2015 | Miyashita | H05B 33/04 313/512 |

* cited by examiner

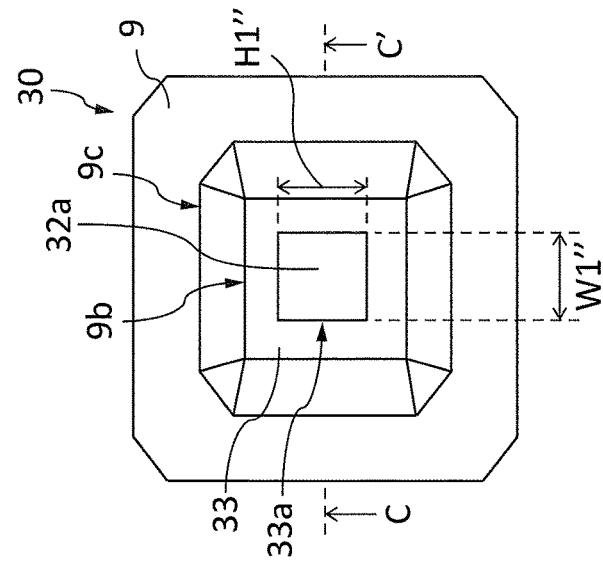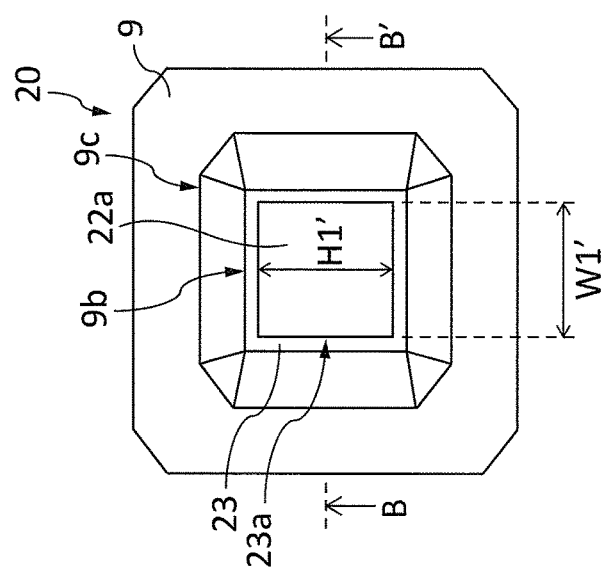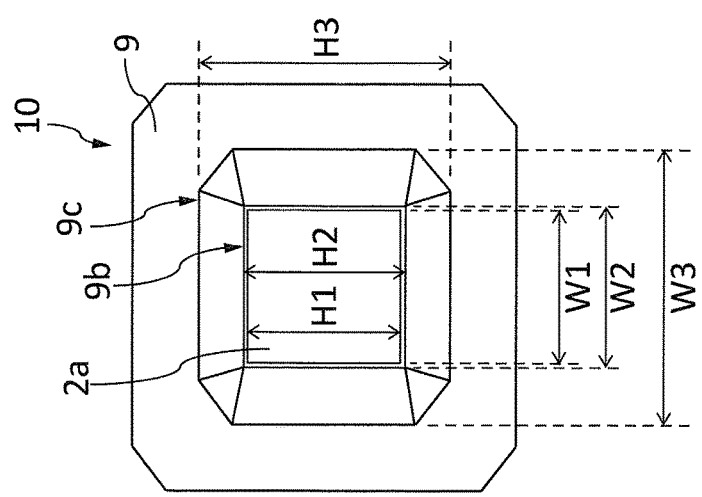

LED LIGHT-EMITTING ELEMENT

CROSS REFERENCE TO RELATED APPLICATION

This application is a new U.S. patent application that claims benefit of JP2015-153355, filed on Aug. 3, 2015. The entire contents of JP2015-153355 are hereby incorporated by reference.

TECHNICAL FIELD

The present invention relates to an LED light-emitting element.

BACKGROUND

In recent years, an LED element, which is a semiconductor element, has been used for a flash device, illumination, etc., because an LED element has a long life and excellent drive characteristics and further, is small, excellent in light-emission efficiency, and has vivid luminous color.

FIG. 5 is a section view of an LED light-emitting element 100 described in Japanese Laid Open Patent Document No. 2009-283988. The LED light-emitting element 100 includes a substrate 115, a bonded part 120 installed on the substrate 115 and having an opening 123, an LED element 116 and a phosphor-containing resin 118 installed within the opening 123, and a reflecting frame 119 installed on the bonded part 120. On the substrate 115, an inside area 119b of the reflecting frame 119 is provided and in the inside area 119b, part of the bonded part 120 and the top surface of the phosphor-containing resin 118 are exposed. The top surface of the phosphor-containing resin 118 serves an emission surface 118a of light emitted from the LED element 116 and the phosphor-containing resin 118.

In the LED light-emitting element 100, in order to improve the light collection effect, the dimension of the emission surface of the phosphor-containing resin 118 is made small with respect to the inside area 119b of the reflecting frame 119 so that the light source becomes close to a point light source.

Related Document

SUMMARY

However, if the emission surface is made small with respect to the inside area of the reflecting frame as described above, part of the light emitted from the emission surface is irradiated to an object to be irradiated after being reflected from the reflecting surface of the reflecting frame. Consequently, the area on the object to be irradiated where the light reflected from various portions of the reflecting surface overlaps becomes narrower, and as a result of this, illuminance unevenness becomes more likely to occur on the object to be irradiated.

Consequently, an object of the present invention is to provide an LED light-emitting element that makes it possible to solve the above-described problem.

Further, another object of the present invention is to provide an LED light-emitting element having reduced the occurrence of illuminance unevenness.

The LED light-emitting element has a substrate, an LED element mounted on the substrate, a phosphor resin arranged on the substrate so as to seal the LED element and having an emission surface from which light based on the light emitted from the LED element is emitted, a reflective resin arranged around the phosphor resin, and a reflecting frame having an opening and at least part of which is arranged on the reflective resin, and the reflective resin is arranged directly under the reflecting frame and on the side surface of the phosphor resin, and the area of the emission surface is set so as to occupy 80% or more of the area of the inside area of the reflecting frame, and in the inside area of the reflecting frame, the reflective resin is exposed around the emission surface.

By means of the above-described LED light-emitting element, it is made possible to provide an LED light-emitting element having reduced the occurrence of illuminance unevenness.

BRIEF DESCRIPTION OF THE DRAWINGS

Other features and advantages of the present LED light-emitting element will be apparent from the ensuing description, taken in conjunction with the accompanying drawings, in which:

FIG. 2A is a top view of an LED light-emitting element 10, FIG. 2B is a top view of another LED light-emitting element 20, and FIG. 2C is a top view of an LED light-emitting element 30 for comparison.

DESCRIPTION

Hereinafter, with reference to the attached drawings, various embodiments of the present invention are explained in detail. However, it should be noted that the technical scope of the present invention is not limited to those embodiments but encompasses the inventions described in the claims and equivalents thereof.

Figure 1A:
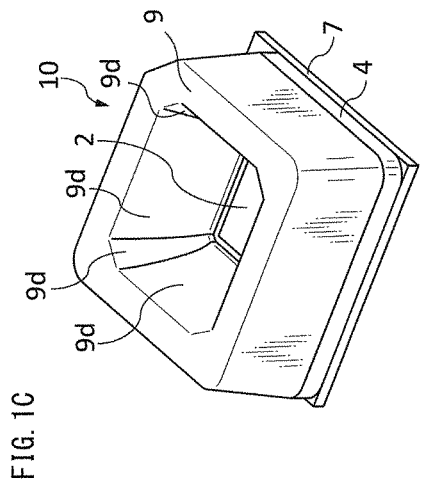
FIG. 1A is a top view of an LED light-emitting element 10.
Figure 1B:
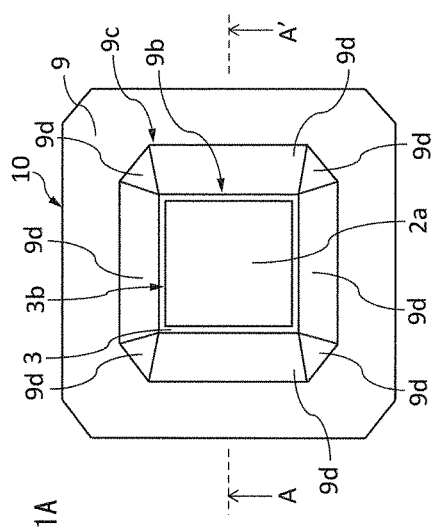
FIG. 1B is a section view along AA' line illustrated in FIG. 1A of the LED light-emitting element 10.
Figure 1C:
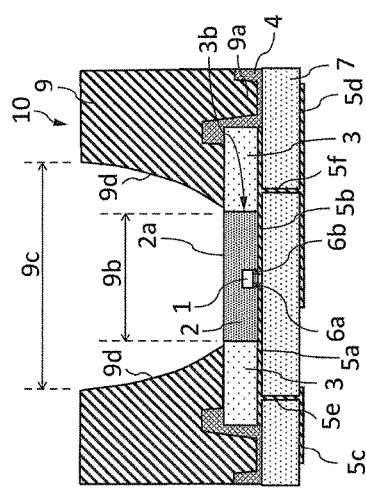
FIG. 1C is a perspective view of the LED light-emitting element 10.

FIG. 1A is a top view of an LED light-emitting element 10, FIG. 1B is a section view along AA' line illustrated in FIG. 1A of the LED light-emitting element 10, and FIG. 1C is a perspective view of the LED light-emitting element 10.

The LED light-emitting element 10 has a substrate 7, a reflective resin 3, an LED element 1, a phosphor resin 2, a reflecting frame 9, etc. On the top surface of the substrate 7, wire electrodes 5a and 5b are provided and on the undersurface of the substrate, power source electrodes 5c and 5d are provided. The wire electrode 5a is connected to the power source electrode 5c via a through hole 5e provided within the substrate 7. The wire electrode 5b is connected to the power source electrode 5d via a through hole 5f provided within the substrate 7.

On the substrate 7, the reflective resin 3 the dimension of which is smaller than that of the substrate 7 is stacked. Near the center of the reflective resin 3, a substantially rectangular opening 3b is formed.

The LED element 1 is flip-chip mounted on the substrate 7 by electrically conductive members 6a and 6b within the opening 3b of the reflective resin 3. The electrically conductive member 6a is brought into conduction with the wire electrode 5a and the electrically conductive member 6b is brought into conduction with the wire electrode 5b.

Within the opening 3b of the reflective resin 3, the phosphor resin 2 is filled so as to seal the LED element 1. As will be described later, the phosphor resin 2 contains phosphor particles that emit light by being excited by the light emitted from the LED element 1. As will be described later, the top surface of the phosphor resin 2 serves as an emission surface 2a from which light based on the light emitted from the LED element 1 is emitted. In an inside area 9b, to be described later, the reflective resin 3 is exposed around the emission surface 2a.

The reflecting frame 9 is fixed onto the substrate 7 with an epoxy resin 4 in such a manner that a step convex part 9a provided on the outer circumference of the side surface is arranged at the side surface of the reflective resin 3. In FIG. 1A, the epoxy resin 4 arranged between the reflecting frame 9 and the reflective resin 3 is not illustrated schematically.

On the reflective resin 3 side of the reflecting frame 9, the substantially rectangular inside area 9b is formed and on the opposite side of the reflective resin 3 of the reflecting frame 9, an octagonal opening 9c is formed. The shape of the inside area 9b and the shape of the opening 9c are not limited to the above-described shapes and may be an arbitrary shape of a polygon, such as a triangle, a hexagon, and an octagon, or an ellipse, a circle, etc.

Between the inside area 9b and the opening 9c, a reflecting surface 9d including eight smooth curves is formed. The number of surfaces of the reflecting surface 9d is not limited to eight and it is possible to arbitrarily set the number in accordance with the shapes of the inside area 9b and the opening 9c. The shape of the reflecting surface 9d is not limited to a curve and may be a flat surface or part of the surface may be a curve.

When a voltage is applied to the power source electrodes 5c and 5d by the external power source, a voltage is applied to the LED element 1 via the through holes 5e and 5f and the wire electrodes 5a and 5b and the LED element 1 emits light. Part of the light emitted from the LED element 1 excites phosphor particles contained in the phosphor resin 2 and the phosphor resin 2 emits light. The light emitted from the LED element 1 and the light emitted from the phosphor resin 2 are directly emitted from or emitted after being reflected from the reflecting surface 9d from the opening 9c. The light that travels from the phosphor resin 2 side toward the reflective resin 3 is reflected from the reflective resin 3 and returns to the phosphor resin 2 side.

FIG. 2A is the top view of the LED light-emitting element 10.

The emission surface 2a of the phosphor resin 2 has a length W1 of about 1.38 mm in the horizontal direction and a length H of about 1.38 mm in the vertical direction. The inside area 9b of the reflecting frame 9 has a length W2 of about 1.45 mm in the horizontal direction and a length H2 of about 1.45 mm in the vertical direction. The opening 9c of the reflecting frame 9 has a length W3 of about 2.3 mm in the horizontal direction and a length H3 of about 2.1 mm in the vertical direction.

From the above, the area of the emission surface 2a of the phosphor resin 2 is about 1.90 mm$^2$ and the area of the inside area 9b of the reflecting frame 9 is about 2.10 mm$^2$. In the inside area 9b, the reflective resin is exposed around the emission surface 2a. Consequently, the area of the emission surface 2a of the phosphor resin 2 is about 90% of the area of the inside area 9b of the reflecting frame 9.

FIG. 2B is the top view of another LED light-emitting element 20.

As will be described later, in the LED light-emitting element 20, the dimension of a phosphor resin 22 differs from the dimension of the phosphor resin 2 of the LED light-emitting element 10. Further, the dimension of an opening 23a of a reflective resin 23 is set to the same dimension of the phosphor resin 22 so that the reflective resin 23 comes into intimate contact with the phosphor resin 22. The other configurations of the LED light-emitting element 20 are the same as those of the LED light-emitting element 10, and therefore, explanation is omitted.

An emission surface 22a of the phosphor resin 22 has a length W1' of about 1.30 mm in the horizontal direction and a length H1' of about 1.30 mm in the vertical direction. Consequently, the area of the emission surface 22a of the phosphor resin 22 is about 1.69 mm$^2$. In the inside area 9b, the reflective resin is exposed around the emission surface 22a. From the above, the area of the emission surface 22a of the phosphor resin 22 is about 80% of the area of the inside area of the reflecting frame 9.

FIG. 2C is the top view of an LED light-emitting element 30 for comparison.

As will be described later, in the LED light-emitting element 30, the dimension of a phosphor resin 32 differs from the dimension of the phosphor resin 2 of the LED light-emitting element 10. Further, the dimension of an opening 33a of a reflective resin 33 is set to the same dimension of the phosphor resin 32 so that the reflective resin 33 comes into intimate contact with the phosphor resin 32. The other configurations of the LED light-emitting element 30 are the same as those of the LED light-emitting element 10, and therefore, explanation is omitted.

An emission surface 32a of the phosphor resin 32 has a length W1" of about 1.00 mm in the horizontal direction and a length H1" of about 1.00 mm in the vertical direction. Consequently, the area of the emission surface 32a of the phosphor resin 32 is about 1.00 mm$^2$. In the inside area 9b, the reflective resin is exposed around the emission surface 32a. From the above, the area of the emission surface 32a of the phosphor resin 32 is about 50% of the area of the inside area of the reflecting frame 9.

Figure 3A:
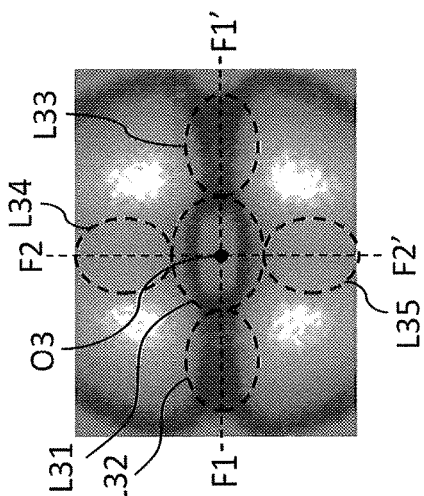
FIGS. 3A and 3B are diagrams for explaining illuminance unevenness by the LED light-emitting element 10.
Figure 3C:
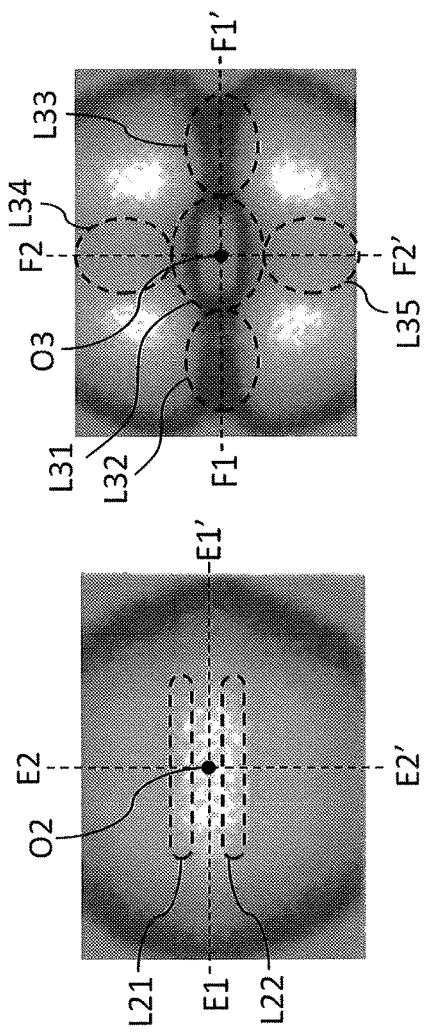
FIGS. 3C and 3D are diagrams for explaining illuminance unevenness by the LED light-emitting element 20.
Figure 3E:
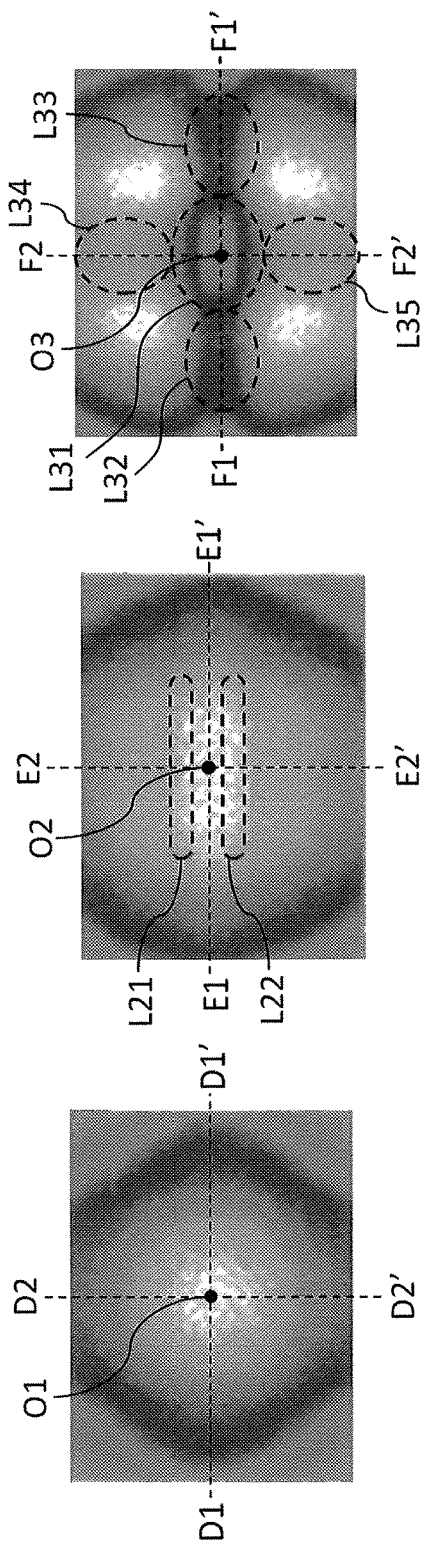
FIGS. 3E and 3F are diagrams for explaining illuminance unevenness by the LED light-emitting element 30.
Figure 3B:
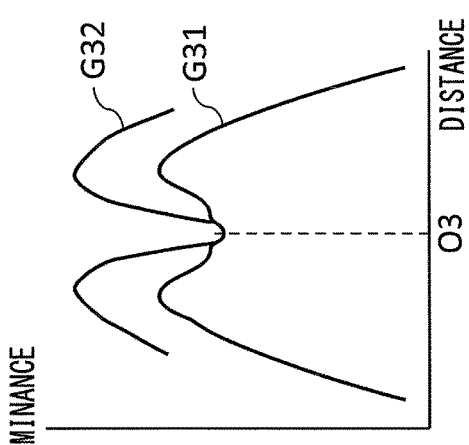

By using FIGS. 3A and 3B, illuminance unevenness by the LED light-emitting element 10 is explained.

FIG. 3A is a diagram illustrating an illuminance distribution on a screen S irradiated by the LED light-emitting element 10. The screen S is installed at a point about 1 m apart from the LED light-emitting element 10 in such a manner that the screen S is perpendicular to an optical axis A1 of the emission surface 2a (see FIG. 4A). A point O1 is a contact between the optical axis A1 and the screen S.

As illustrated in FIG. 3A, on the screen S, a substantially circular area with the point O1 as a center is irradiated. As the distance from the point O1 becomes greater, the illuminance is reduced at a predetermined rate substantially concentrically and there is no conspicuous streak or shadow.

FIG. 3B is a graph representing an illuminance distribution G11 on the screen S along D1-D1' line illustrated in FIG. 3A and an illuminance distribution G12 on the screen S along D2-D2' line illustrated in FIG. 3A. In the graph illustrated in FIG. 3B, the horizontal axis represents the distance from the point O1 along D1-D1' line or D2-D2' line and the vertical axis represents the illuminance on the screen S.

As illustrated in FIG. 3B, the illuminance distribution G11 is a curve convex in the upward direction, having a local maximum in the vicinity of the point O1, and substantially symmetric with respect to the point O1. Similarly, the illuminance distribution G12 is a curve convex in the upward direction, having a local maximum in the vicinity of the point O1, and substantially symmetric with respect to the point O1. The illuminance distribution G11 and the illuminance distribution G12 substantially overlap each other. In the illuminance distributions G11 and G12, as the distance from the point O1 becomes greater, the illuminance is reduced at a predetermined rate. Consequently, as illustrated in FIG. 3A, on the screen S, there is no conspicuous streak or shadow, and therefore, it can be concluded that there is no illuminance unevenness by the LED light-emitting element 10.

Figure 3D:
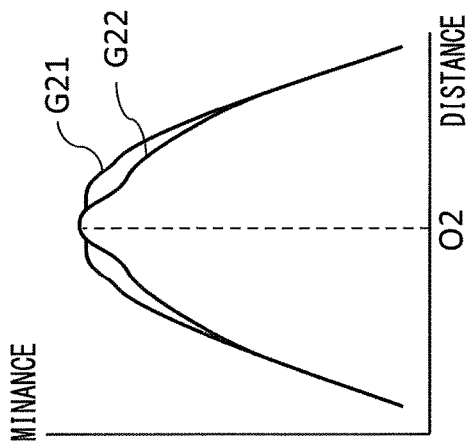

By using FIGS. 3C and 3D, illuminance unevenness by the LED light-emitting element 20 is explained.

FIG. 3C is a diagram illustrating an illuminance distribution on the screen S irradiated by the LED light-emitting element 20. The screen S is installed at a point about 1 m apart from the LED light-emitting element 20 in such a manner that the screen S is perpendicular to an optical axis A2 of the emission surface 22a (see FIG. 4B). A point O2 is a contact between the optical axis A2 and the screen S.

As illustrated in FIG. 3C, on the screen S, a substantially circular area with the point O2 as a center is irradiated. In this illuminance distribution, although a streak or shadow is observed in each of areas surrounded by dot lines L21 and L22, but as the distance from the point O2 becomes greater, the illuminance is reduced at a predetermined rate substantially concentrically.

FIG. 3D is a graph representing an illuminance distribution G21 on the screen S along E1-E1' line illustrated in FIG. 3C and an illuminance distribution G22 on the screen S along E2-E2' line illustrated in FIG. 3C. In the graph illustrated in FIG. 3D, the horizontal axis represents the distance from the point O2 along E1-E1' line or E2-E2' line and the vertical axis represents the illuminance on the screen S.

As illustrated in FIG. 3D, the illuminance distribution G21 is a curve convex in the upward direction, having a local maximum in the vicinity of the point O2, and substantially symmetric with respect to the point O2. In the illuminance distribution G21, as the distance from the point O2 becomes greater, the illuminance is reduced at a predetermined rate. The illuminance distribution G22 is a curve convex in the upward direction, having a local maximum equal to that of the illuminance distribution G21 in the vicinity of the point O2, and substantially symmetric with respect to the point O2. In the illuminance distribution G22, as the distance from the point O2 becomes greater, first, the illuminance is reduced at a rate faster that that of the illuminance distribution G21, but soon the rate becomes slower and as the distance from the point O2 becomes further greater, the illuminance distribution G22 comes to substantially overlap with the illuminance distribution G21. Consequently, as illustrated in FIG. 3C, a slight streak or shadow is observed on the screen S (see the dot lines L21 and L22), but it can be concluded that the illuminance unevenness by the LED light-emitting element 20 is small.

Figure 3F:
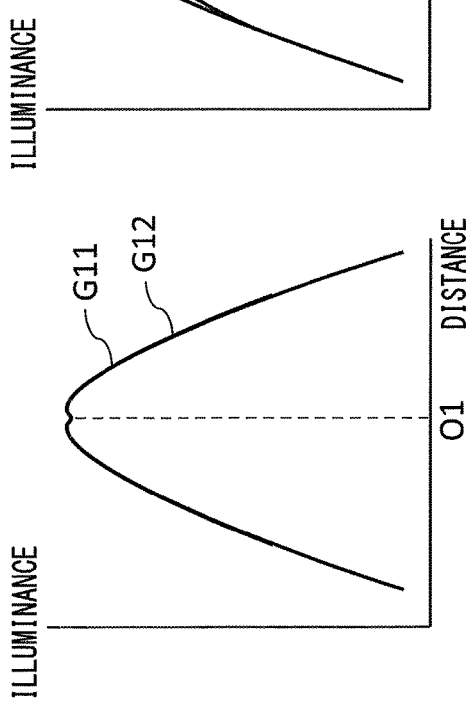

By using FIGS. 3E and 3F, illuminance unevenness by the LED light-emitting element 30 is explained.

FIG. 3E is a diagram illustrating an illuminance distribution on the screen S irradiated by the LED light-emitting element 30. The screen S is installed at a point about 1 m apart from the LED light-emitting element 30 in such a manner that the screen S is perpendicular to an optical axis A3 of the emission surface 32a (see FIG. 4C). A point O3 is a contact between the optical axis A3 and the screen S.

As illustrated in FIG. 3E, on the screen S, a substantially circular area with the point O3 as a center is irradiated. However, the illuminance in the area surrounded by a dot line L31 is reduced extremely. Further, also in the areas surrounded by L32, L33, L34, and L35, the illuminance is reduced.

FIG. 3F is a graph representing an illuminance distribution G31 on the screen S along F1-F1' line illustrated in FIG. 3E and an illuminance distribution G32 on the screen S along F2-F2' line illustrated in FIG. 3E. In the graph illustrated in FIG. 3F, the horizontal axis represents the distance from the point O3 along F1-F1' line or F2-F2' line and the vertical axis represents the illuminance on the screen S.

As illustrated in FIG. 3F, the illuminance distribution G31 is a curve in a shape substantially resembling letter M, substantially symmetrical with respect to the point O3, having a local minimum in the vicinity of the point O3, and having two local maxima substantially equal to each other in such a manner as to sandwich the point O3. Similarly, the illuminance distribution G32 is a curve in a shape substantially resembling letter M, substantially symmetrical with respect to the point O3, having a local minimum in the vicinity of the point O3, and having two local maxima substantially equal to each other in such a manner as to sandwich the point O3. The local minimum of the illuminance distribution G31 and the local minimum of the illuminance distribution G32 are equal and at an arbitrary distance from the point O3, the illuminance of the illuminance distribution G32 is higher than the illuminance of the illuminance distribution G31. Consequently, as illustrated in FIG. 3E, on the screen S, clear streaks or shadows are seen (see the dot lines L31, L32, L33, L34, and L35), and therefore, it can be concluded that the illuminance unevenness by the LED light-emitting element 30 is large.

Figure 4A:
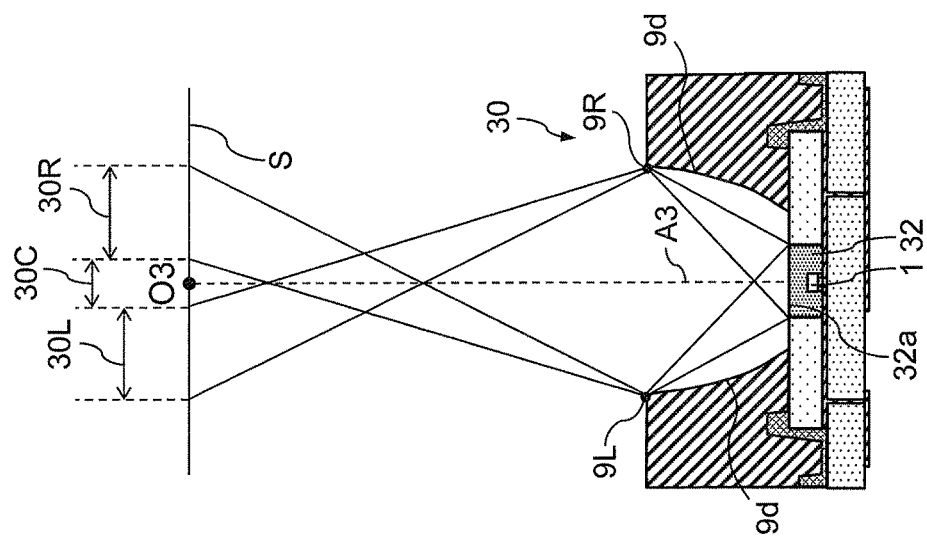
FIG. 4A is a diagram for explaining the way of irradiation by the LED light-emitting element 10.
Figure 4B:
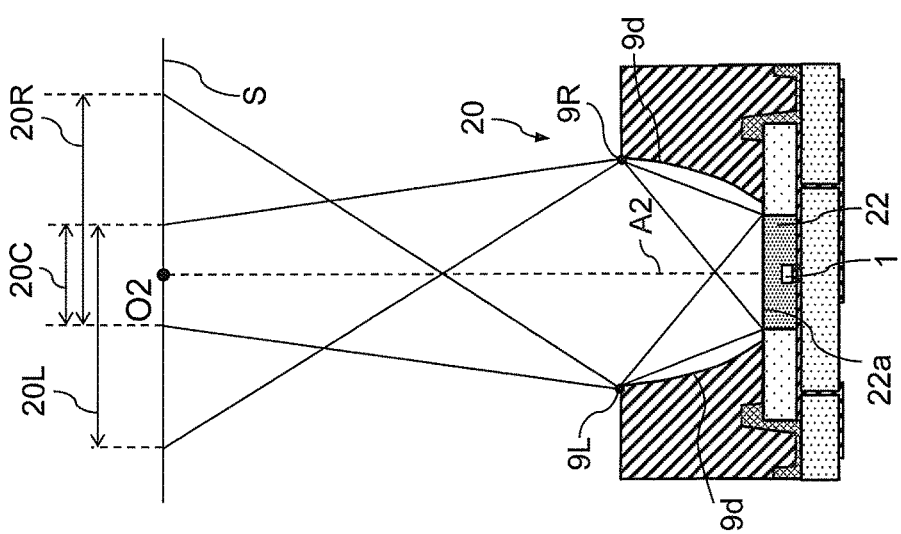
FIG. 4B is a diagram for explaining the way of irradiation by the LED light-emitting element 20.
Figure 4C:
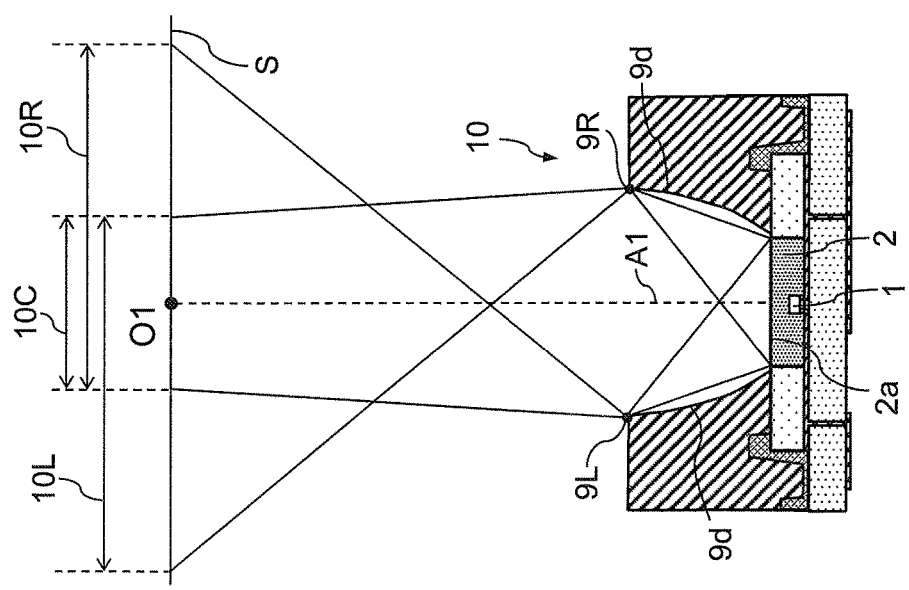
FIG. 4C is a diagram for explaining the way of irradiation by the LED light-emitting element 30.
Figure 5:
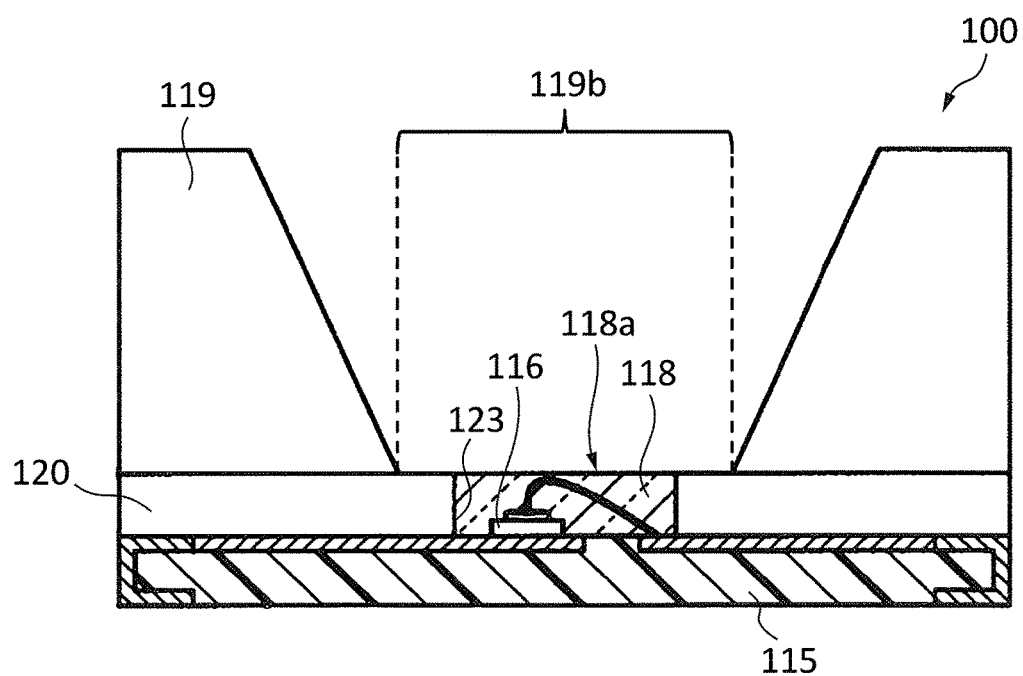
FIG. 5 is a section view of the LED light-emitting element 100 described in Patent Document 1.

By using FIGS. 4A to 4C, the mechanism in which illuminance unevenness occurs by the LED light-emitting elements 10 to 30 is explained.

The light emitted from the emission surfaces 2a, 22a, and 32a and with which the surface of the screen S is irradiated directly hardly contributes the occurrence of illuminance unevenness. Because of this, in the following explanation, the light emitted from the emission surfaces 2a, 22a, and 32a and with which the surface of the screen S is irradiated directly is not taken into consideration.

The oriented direction of the light emitted from the emission surfaces 2a, 22a, and 32a almost coincides with the normal direction of the emission surfaces 2a, 22a, and 32a. Among the light emitted from the emission surfaces 2a, 22a, and 32a, there exists light having an oriented direction with a predetermined angle from the normal direction, but the ratio of the light decreases as the angle from the normal direction becomes greater. For example, the ratio of the light having the oriented direction with 90 degrees from the normal direction is almost equal to zero. Because of this, in the following explanation, among the light reflected from the reflecting surface 9d, the light whose angle formed by the emission surface 2a and the normal A1, or by the emission surface 22a and the normal A2, or by the emission surface 32a and the normal A3 is the smallest, i.e., the light reflected from points 9R and 9L closest to the screen S on the reflecting surface 9d is considered mainly.

FIG. 4A is a diagram for explaining the way of irradiation by the LED light-emitting element 10. That is, in FIG. 4A, the section view along AA' line illustrated in FIG. 1B of the LED light-emitting element 10 and the section view along D1-D1' line illustrated in FIG. 3A of the screen S are illustrated.

As illustrated in FIG. 4A, among the light emitted from the emission surface 2a, the light reflected from the reflecting point 9R of the reflecting surface 9d irradiates a left-side irradiation area 10L on the screen S from the LED light-emitting element 10. Similarly, among the light emitted from the emission surface 2a, the light reflected from the reflecting point 9L of the reflecting surface 9d irradiates a right-side irradiation area 10R on the screen S. Parts of the areas 10L and 10R overlap at an overlap 10C on the screen S.

FIG. 4B is a diagram for explaining the way of irradiation by the LED light-emitting element 20. That is, in FIG. 4B, the section view along BB' line illustrated in FIG. 2B of the LED light-emitting element 20 and the section view along E1-E1' line illustrated in FIG. 3C of the screen S are illustrated.

As illustrated in FIG. 4B, among the light emitted from the emission surface 22a, the light reflected from the reflecting point 9R of the reflecting surface 9d irradiates a left-side irradiation area 20L on the screen S from the LED light-emitting element 20. Similarly, among the light emitted from the emission surface 22a, the light reflected from the reflecting point 9L of the reflecting surface 9d irradiates a right-side irradiation area 20R on the screen S. Parts of the areas 20L and 20R overlap at an overlap 20C on the screen S.

FIG. 4C is a diagram for explaining the way of irradiation by the LED light-emitting element 30. That is, in FIG. 4C, the section view along CC' line illustrated in FIG. 2C of the LED light-emitting element 30 and the section view along F1-F1' line illustrated in FIG. 3E of the screen S are illustrated.

As illustrated in FIG. 4C, among the light emitted from the emission surface 32a, the light reflected from the reflecting point 9R of the reflecting surface 9d irradiates a left-side irradiation area 30L on the screen S from the LED light-emitting element 30. Similarly, among the light emitted from the emission surface 32a, the light reflected from the reflecting point 9L of the reflecting surface 9d irradiates a right-side irradiation area 30R on the screen S. The left-side irradiation area 30L and the right-side irradiation area 30R do not overlap and are located apart with an area 30C in between. Because of this, in FIG. 3E, the illuminance unevenness by the LED light-emitting element 30 becomes large in such a manner that the illuminance of the areas surrounded by the dot lines L31 to L35 becomes low.

From FIGS. 4A to 4C, it can be concluded that as the ratio of the area of the emission surface of the phosphor resin to the area of the inside area of the reflecting frame becomes larger, the area of the overlap of the left-side irradiation area and the right-side irradiation area becomes greater, and as a result of this, the illuminance unevenness in an object to be irradiated is reduced. The effect of the reduction in illuminance unevenness such as this hardly appears in the case where the ratio of the area of the emission surface of the phosphor resin to the area of the inside area of the reflecting frame is 50% as illustrated in FIG. 4C, but in the case where the ratio is 80%, the effect appears as illustrated in FIG. 4B. Consequently, it can be concluded that the effect of the reduction in illuminance unevenness appears in the case where the ratio of the area of the emission surface of the phosphor resin to the area of the inside area of the reflecting frame is 80% or higher. From the above, it is preferable for the ratio of the area of the emission surface of the phosphor resin to the area of the inside area of the reflecting frame to be 80% or higher.

In the LED light-emitting element 10, the ratio of the area of the emission surface 2a of the phosphor resin 2 to the area of the inside area 9b of the reflecting frame 9 is set to 90% in view of the accuracy error. However, the ratio is not limited to this, and it may also be possible to set the ratio of the area of the emission surface of the phosphor resin to the area of the inside area of the reflecting frame to 100% by making the area of the emission surface of the phosphor resin the same as the area of the inside area of the reflecting frame or by making the area of the emission surface of the phosphor resin greater than the area of the inside area of the reflecting frame.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting element comprising:
a substrate;
an LED element mounted on the substrate;
a phosphor resin arranged on the substrate so as to seal the LED element and having an emission surface from which light based on light emitted from the LED element is emitted;
a reflective resin which is arranged around the phosphor resin, and which has an opening filled with the phosphor resin; and
a reflecting frame having an opening and at least part of which is arranged on the reflective resin, wherein
the reflective resin is arranged directly under the reflecting frame and on the side surface of the phosphor resin,
the ratio of the area of the emission surface to the area of an inside area of the reflecting frame is set to 80% or higher, and
in the inside area of the reflecting frame, the reflective resin is exposed around the emission surface.

2. The light-emitting element of claim 1, wherein the reflective resin is stacked on the substrate, wherein a dimension of the reflective resin is smaller than the substrate.

3. The light-emitting element of claim 1, further comprising a step convex part provided on an outer circumference of the reflecting frame, wherein the reflecting frame is fixed onto the substrate such that the step convex part is arranged at a side surface of the reflective resin.

* * * * *